(12) United States Patent
Gambino et al.

(10) Patent No.: US 7,781,292 B2
(45) Date of Patent: Aug. 24, 2010

(54) HIGH POWER DEVICE ISOLATION AND INTEGRATION

(75) Inventors: Jeffrey Peter Gambino, Westford, VT (US); Steven Howard Voldman, South Burlington, VT (US); Michael Joseph Zierak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 494 days.

(21) Appl. No.: 11/741,889

(22) Filed: Apr. 30, 2007

(65) Prior Publication Data

US 2008/0265363 A1    Oct. 30, 2008

(51) Int. Cl.
*H01L 21/336*    (2006.01)

(52) U.S. Cl. .............. 438/294; 257/335; 257/E21.417; 257/E21.418; 257/E29.256; 257/E29.257; 257/E29.261; 438/221

(58) Field of Classification Search .................. 438/275, 438/221, 294; 257/335, E21.417, E21.418, 257/E29.027, E29.066, E29.256, E29.257, 257/E29.261; *H01L 21/336, 21/762, 27/088, H01L 29/06, 29/78*
See application file for complete search history.

(56) References Cited

U.S. PATENT DOCUMENTS

| 5,468,984 | A | 11/1995 | Efland et al. |
| 5,578,860 | A | 11/1996 | Costa et al. |
| 6,770,938 | B1 | 8/2004 | Fliesler et al. |
| 6,774,411 | B2 * | 8/2004 | Schuegraf .................. 257/197 |
| 7,027,277 | B1 | 4/2006 | Vashchenko et al. |
| 7,129,559 | B2 | 10/2006 | Wu et al. |
| 7,435,661 | B2 * | 10/2008 | Miller et al. ................ 438/424 |
| 2006/0237794 | A1 | 10/2006 | Husher |
| 2006/0252257 | A1 * | 11/2006 | Ahn et al. ................... 438/637 |
| 2007/0018273 | A1 * | 1/2007 | Miller et al. ................ 257/506 |
| 2007/0054464 | A1 * | 3/2007 | Zhang ......................... 438/424 |
| 2007/0252731 | A1 * | 11/2007 | Chung ......................... 341/50 |

* cited by examiner

*Primary Examiner*—Asok K Sarkar
(74) *Attorney, Agent, or Firm*—Schmeiser, Olsen & Watts; Ryan K. Simmons

(57) ABSTRACT

A structure and method of fabricating the structure. The structure including: a dielectric isolation in a semiconductor substrate, the dielectric isolation extending in a direction perpendicular to a top surface of the substrate into the substrate a first distance, the dielectric isolation surrounding a first region and a second region of the substrate, a top surface of the dielectric isolation coplanar with the top surface of the substrate; a dielectric region in the second region of the substrate; the dielectric region extending in the perpendicular direction into the substrate a second distance, the first distance greater than the second distance; and a first device in the first region and a second device in the second region, the first device different from the second device, the dielectric region isolating a first element of the second device from a second element of the second device.

20 Claims, 10 Drawing Sheets

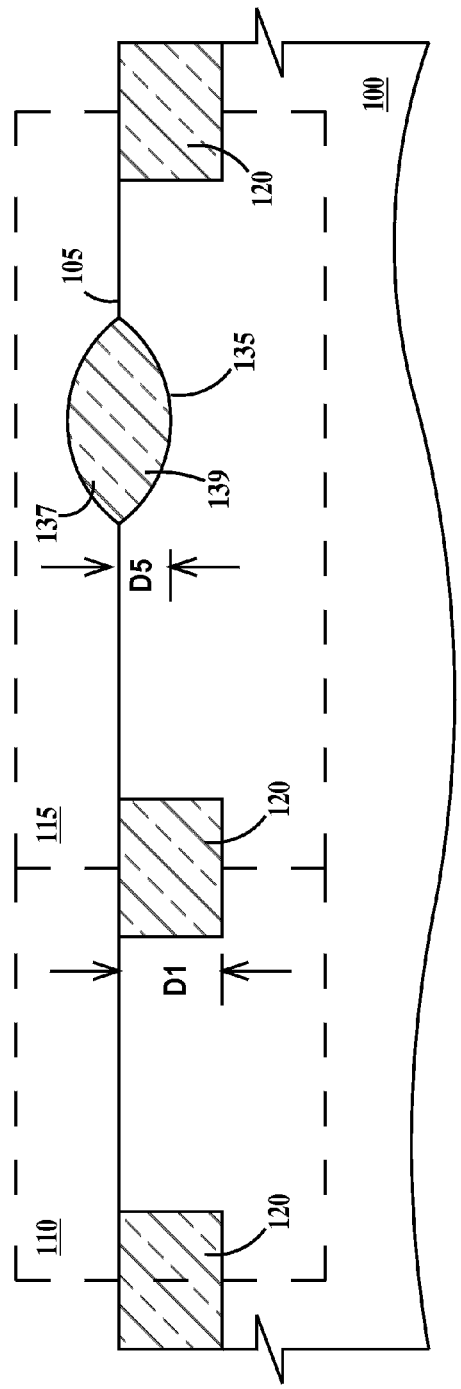
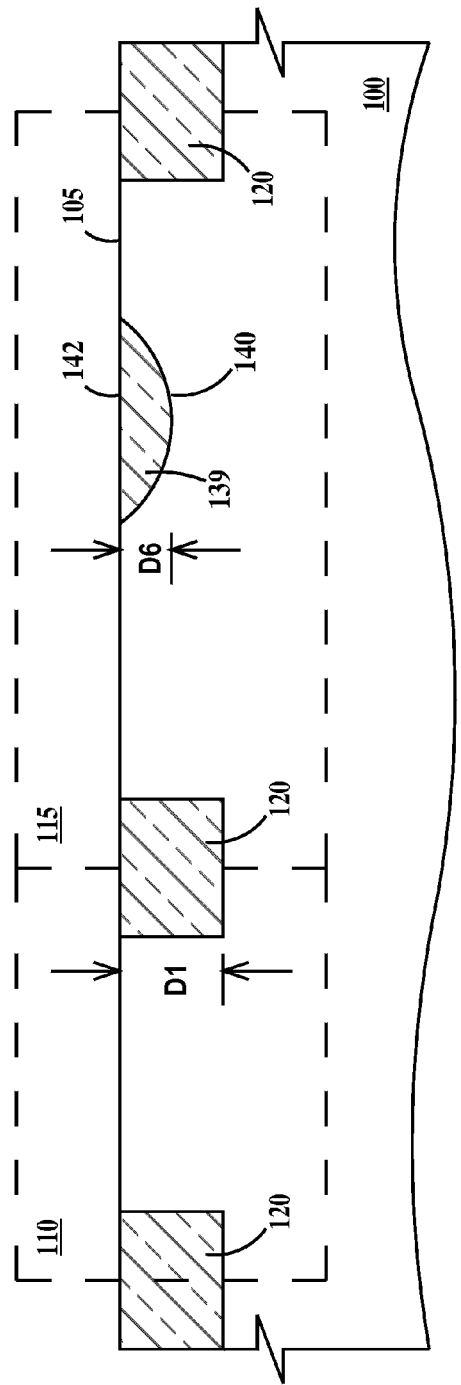
FIG. 1C
FIG. 1D

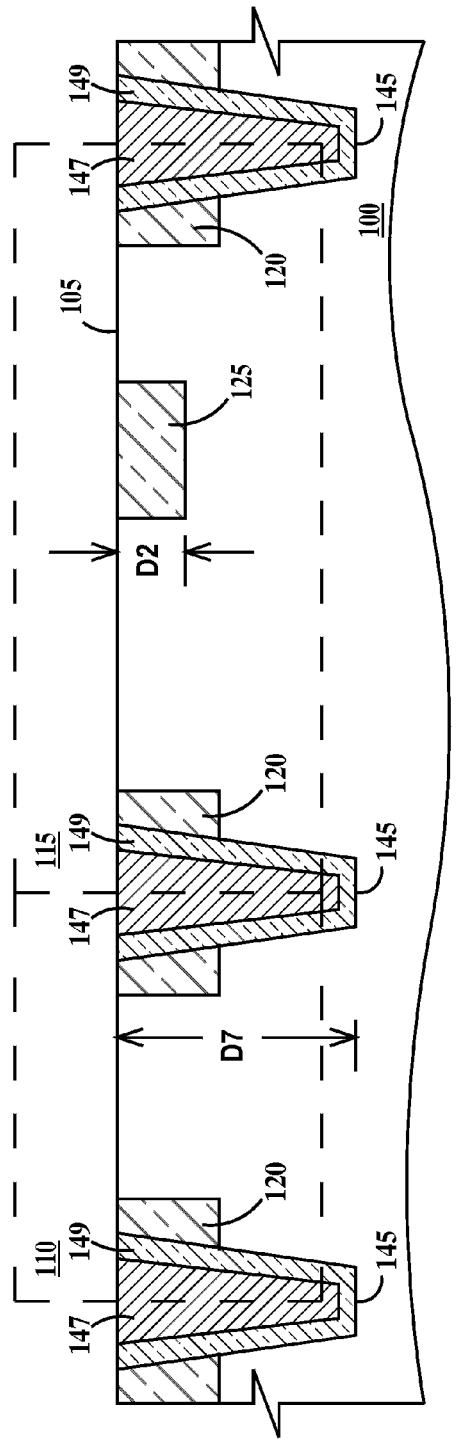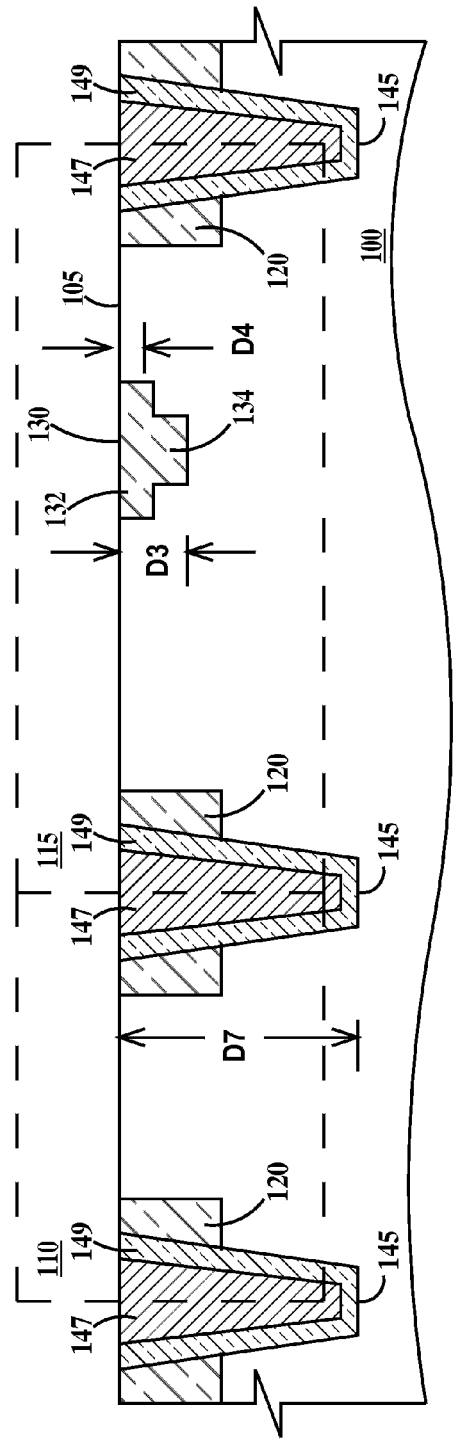

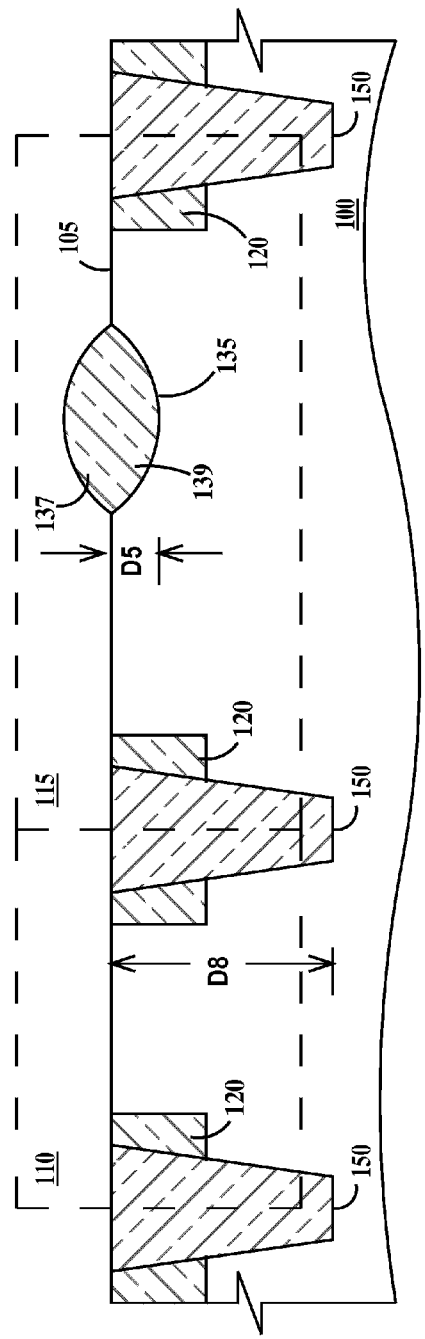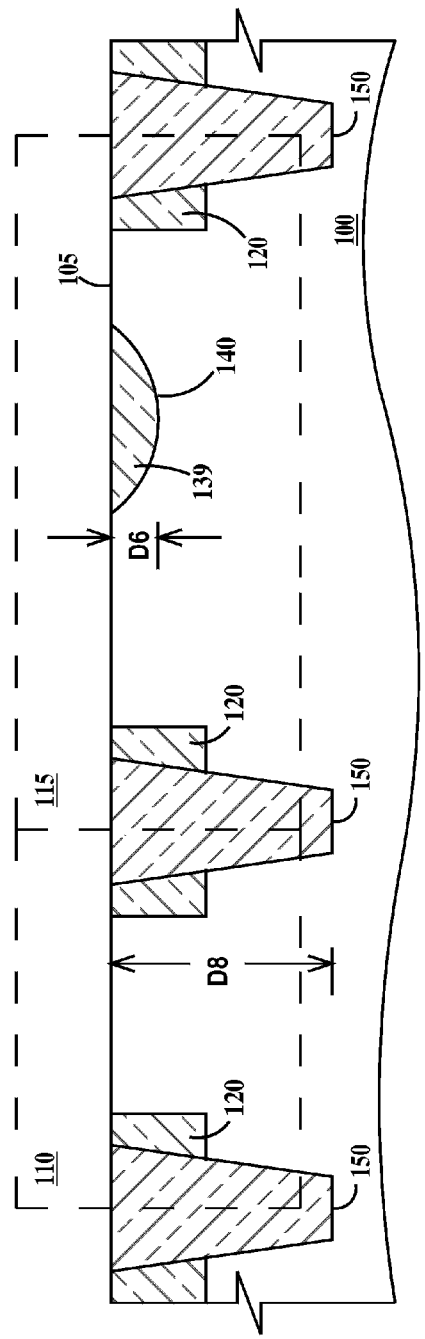

HIGH POWER DEVICE ISOLATION AND INTEGRATION

FIELD OF THE INVENTION

The present invention relates to the field of high power devices; more specifically, it relates to high power devices, isolation of high power devices and methods of manufacturing high power devices and integration of high power devices with conventional logic and memory devices.

BACKGROUND OF THE INVENTION

High power devices utilize internal dielectric isolation to electrically isolate internal elements of the devices from each other as well as dielectric isolation to electrically isolate the high power devices from other, lower power, devices. Conventional isolation methods result in a compromise between the effectiveness of the inter-device isolation and the performance of the high power devices. Accordingly, there exists a need in the art to overcome the deficiencies and limitations described hereinabove.

SUMMARY OF THE INVENTION

A first aspect of the present invention is a method of fabricating an electronic device, comprising: forming a dielectric isolation in a semiconductor substrate, the dielectric isolation extending in a direction perpendicular to a top surface of the substrate into the substrate a first distance, the dielectric isolation surrounding a first region and a second region of the substrate, a top surface of the dielectric isolation coplanar with the top surface of the substrate; forming a dielectric region in the second region of the substrate; the dielectric region extending in the perpendicular direction into the substrate a second distance, the first distance greater than the second distance; and forming a first device in the first region and forming a second device in the second region, the first device different from the second device, the dielectric region isolating a first element of the second device from a second element of the second device.

A second aspect of the present invention is a structure, comprising: a dielectric isolation in a semiconductor substrate, the dielectric isolation extending in a direction perpendicular to a top surface of the substrate into the substrate a first distance, the dielectric isolation surrounding a first region and a second region of the substrate, a top surface of the dielectric isolation coplanar with the top surface of the substrate; a dielectric region in the second region of the substrate; the dielectric region extending in the perpendicular direction into the substrate a second distance, the first distance greater than the second distance; and a first device in the first region and a second device in the second region, the first device different from the second device, the dielectric region isolating a first element of the second device from a second element of the second device.

BRIEF DESCRIPTION OF THE DRAWINGS

The features of the invention are set forth in the appended claims. The invention itself, however, will be best understood by reference to the following detailed description of an illustrative embodiment when read in conjunction with the accompanying drawings, wherein:

FIG. 1C is a cross-section illustrating the first inter-device isolation scheme with a third intra-device isolation scheme according to embodiments of the present invention;

FIG. 1D is a cross-section illustrating the first inter-device isolation scheme with a fourth intra-device isolation scheme according to embodiments of the present invention;

FIG. 2A is a cross-section illustrating a second inter-device isolation scheme with the first intra-device isolation scheme according to embodiments of the present invention;

FIG. 2B is a cross-section illustrating the second inter-device isolation scheme with the second intra-device isolation scheme according to embodiments of the present invention;

FIG. 3C is a cross-section illustrating the third inter-device isolation scheme with the third intra-device isolation scheme according to embodiments of the present invention;

FIG. 3D is a cross-section illustrating the third inter-device isolation scheme with the fourth intra-device isolation scheme according to embodiments of the present invention;

DETAILED DESCRIPTION OF THE INVENTION

Figure 1A:
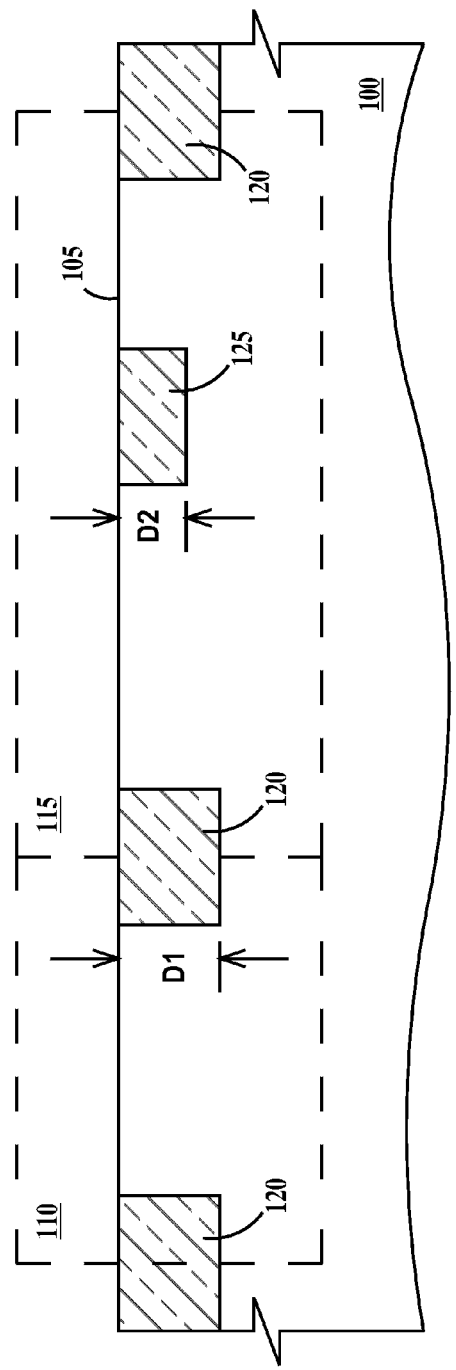
FIG. 1A is a cross-section illustrating a first inter-device isolation scheme with a first intra-device isolation scheme according to embodiments of the present invention.

FIG. 1A is a cross-section illustrating a first inter-device isolation scheme with a first intra-device isolation scheme according to embodiments of the present invention. In FIG. 1A, a semiconductor substrate 100 has a top surface 105 and includes a first region 110 and a second region 115. First region 110 is exemplary of multiple first regions 110 and second region 115 is exemplary of multiple second regions 115. First region(s) 110 are electrically isolated from each other and from second regions 115 by shallow trench isolation (STI) 120. Second region(s) 115 are also electrically isolated from each other and from first regions 110 by STI 120. STI 120 extends a perpendicular distance D1 from top surface 105 of substrate 100 into the substrate. Within second region(s) 115 is a very shallow trench isolation(s) (VSTI) 125. VSTI 125 extends a perpendicular distance D2 from top surface 105 of substrate 100 into the substrate. D1 is greater than D2. Conventional power devices such as p-channel and n-channel field effect transistors (NFETs and PFETs), bipolar transistors and diodes may be fabricated in first regions 110 of substrate 100. High power devices such as lateral double diffused metal-oxide-silicon (LDMOS) devices may be fabricated in second regions 115. In the case of LDMOS devices, VSTI is formed under the gate in the drain side of the LDMOS device (see FIGS. 4A and 4B and description infra).

In one example, substrate 100 is a single crystal silicon substrate. In one example, STI and VSTI independently comprise tetraethoxysilane (TEOS) oxide or high-density plasma (HDP) oxide. In one example, STI 120 and VSTI 125 may be formed by etching two sets of trenches of different depths into substrate 100, overfilling the trenches with a dielectric material and then performing a chemical-mechanical polish (CMP) to remove excess dielectric material so top surfaces of STI 120 and VSTI 125 are coplanar with top surface 105 of the substrate. Either STI 120 or VSTI 125 may be formed fully formed first or the STI 120 and VSTI 125 trenches may be formed separately and filled simultaneously. In one example, a high voltage device is a device capable of sustaining about 25 volts or more of gate to drain voltage. The value of D1 is chosen to optimize inter-device leakage and the value of D2 chosen to optimize the speed of the high voltage device.

Figure 1B:
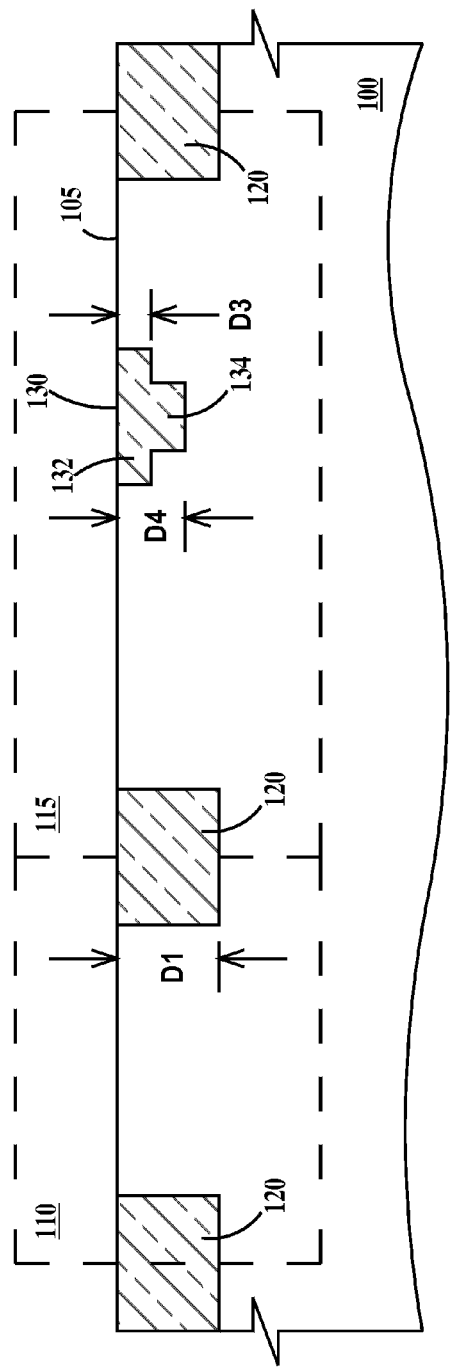
FIG. 1B is a cross-section illustrating the first inter-device isolation scheme with a second intra-device isolation scheme according to embodiments of the present invention.

FIG. 1B is a cross-section illustrating the first inter-device isolation scheme with a second intra-device isolation scheme according to embodiments of the present invention. FIG. 1B is similar to FIG. 1A except VSTI 125 of FIG. 1A is replaced with dual-depth STI (DDSTI) 130. DDSTI 130 includes a thin region 132 and a thick region 134. Thin region 132 of DDSTI 130 extends a perpendicular distance D3 from top surface 105 of substrate 100 into the substrate. Thick region 134 of DDSTI 130 extends a perpendicular distance D4 from top surface 105 of substrate 100 into the substrate. D1 is greater than D4. In one example, DDSTI comprises tetraethoxysilane (TEOS) oxide or high-density plasma (HDP) oxide. In one example, STI 120 and DDSTI 130 may be formed by etching three sets trenches of different depths. Two sets of the three sets of trenches form the DDSTI into substrate 100, overfilling the trenches with a dielectric material and then performing a chemical-mechanical polish (CMP) to remove excess dielectric material so top surfaces of STI 120 and DDSTI 130 are coplanar with top surface 105 of the substrate. Either STI 120 or DDSTI 130 may be formed fully formed first or the STI 120 and DDSTI 125 trenches may be formed separately and filled simultaneously. In the case of LDMOS devices, DDSTI is formed under the gate in the drain side of the LDMOS device. The values of D3 and D4 are chosen to optimize the speed of the high voltage device.

FIG. 1C is a cross-section illustrating a first inter-device isolation scheme with a third intra-device isolation scheme according to embodiments of the present invention. FIG. 1C is similar to FIG. 1A except VSTI 125 of FIG. 1A is replaced with local oxidation of silicon (LOCOS) 135. LOCOS 135 includes an upper region 137 extending above top surface 105 of substrate 100 and a lower region 139 extending a perpendicular distance D5 from the top surface of the substrate into the substrate. D1 is greater than D5. LOCOS is formed by masking regions of top surface 105 with a material such as silicon nitride and exposing the unmasked regions at many hundreds of degrees centigrade to oxygen or water steam. STI 120 is formed by etching a set of trenches, filling the trenches and performing a CMP as described supra. In one example, STI 120 is formed before LOCO 135. In the case of LDMOS devices, LOCOS is formed under the gate in the drain side of the LDMOS device. The value of D5 is chosen to optimize the speed of the high voltage device.

FIG. 1D is a cross-section illustrating a first inter-device isolation scheme with a fourth intra-device isolation scheme according to embodiments of the present invention. FIG. 1D is similar to FIG. 1A, except a CMP has been performed to remove upper portion 137 (see FIG. 1D) of LOCOS 140 making a top surface 142 of remaining of LOCOS 140 coplanar with top surface 105 of substrate 140. In the case of LDMOS devices, the remaining LOCOS is formed under the gate in the drain side of the LDMOS device. Distance D5 is now D6 (D6 less than or equal to D5), as the possibility exists that some of the substrate may be removed by the CMP operation.

FIG. 2A is a cross-section illustrating a second inter-device isolation scheme with the first intra-device isolation scheme according to embodiments of the present invention. FIG. 2A is similar to FIG. 1A, except a deep trench isolation (DTI) 145 is formed through STI 120. DTI 145 includes a polysilicon core surrounded by a dielectric layer 149. In one example dielectric liner 149 is silicon oxide. In one example DTI 145 is formed by etching a trench through STI 120 into substrate 100, forming a conformal dielectric layer on the bottom and sidewalls of the trench, filling the trench with polysilicon (e.g. using a chemical-vapor-deposition (CVD) process) and then performing a CMP process. DTI 145 extends a perpendicular distance D7 from top surface 105 of substrate 100 into the substrate. D7 is greater than D2.

FIG. 2B is a cross-section illustrating the second inter-device isolation scheme with the second intra-device isolation scheme according to embodiments of the present invention. FIG. 2B is similar to FIG. 1B, except DTI 145 is formed through STI 120. DTI 145 extends a perpendicular distance D7 from top surface 105 of substrate 100 into the substrate. D7 is greater than D3.

Figure 2C:
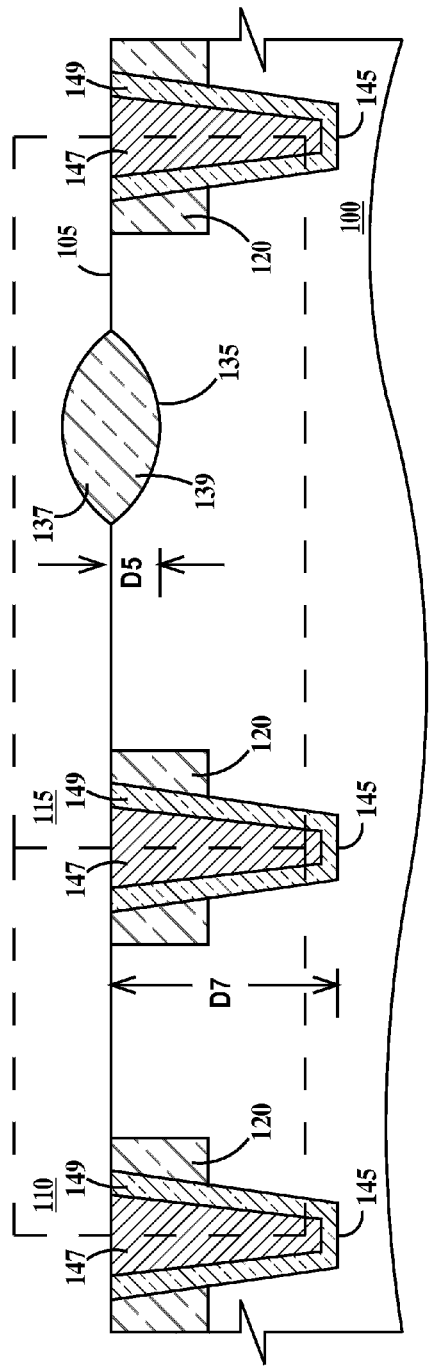
FIG. 2C is a cross-section illustrating the second inter-device isolation scheme with the third intra-device isolation scheme according to embodiments of the present invention.

FIG. 2C is a cross-section illustrating the second inter-device isolation scheme with the third intra-device isolation scheme according to embodiments of the present invention. FIG. 2C is similar to FIG. 1C, except DTI 145 is formed through STI 120. DTI 145 extends a perpendicular distance D7 from top surface 105 of substrate 100 into the substrate. D7 is greater than D5.

Figure 2D:
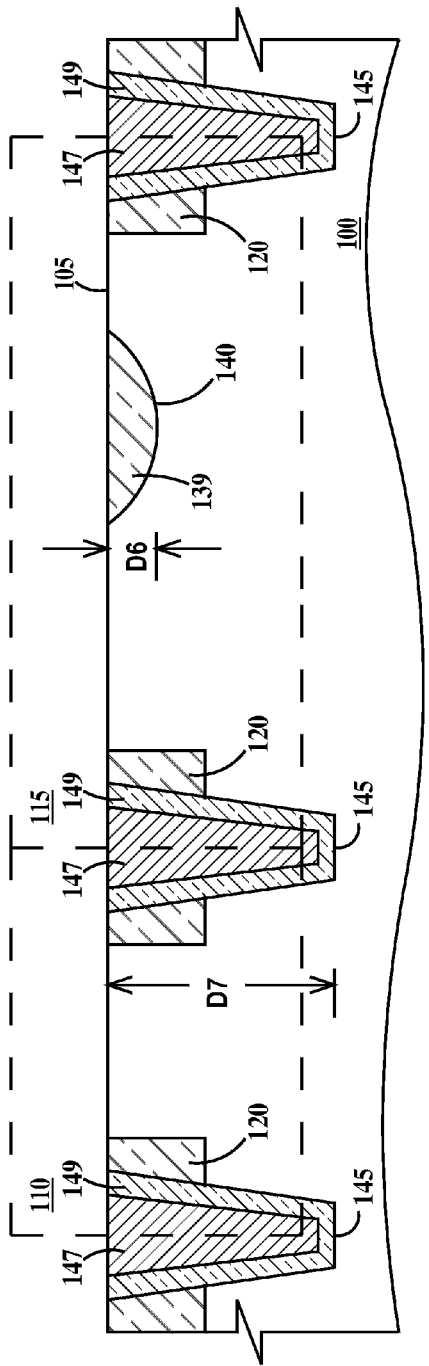
FIG. 2D is a cross-section illustrating the second inter-device isolation scheme with the fourth intra-device isolation scheme according to embodiments of the present invention.

FIG. 2D is a cross-section illustrating the second inter-device isolation scheme with the fourth intra-device isolation scheme according to embodiments of the present invention. FIG. 2D is similar to FIG. 1D, except DTI 145 is formed through STI 120. DTI 145 extends a perpendicular distance D7 from top surface 105 of substrate 100 into the substrate. D7 is greater than D6.

Figure 3A:
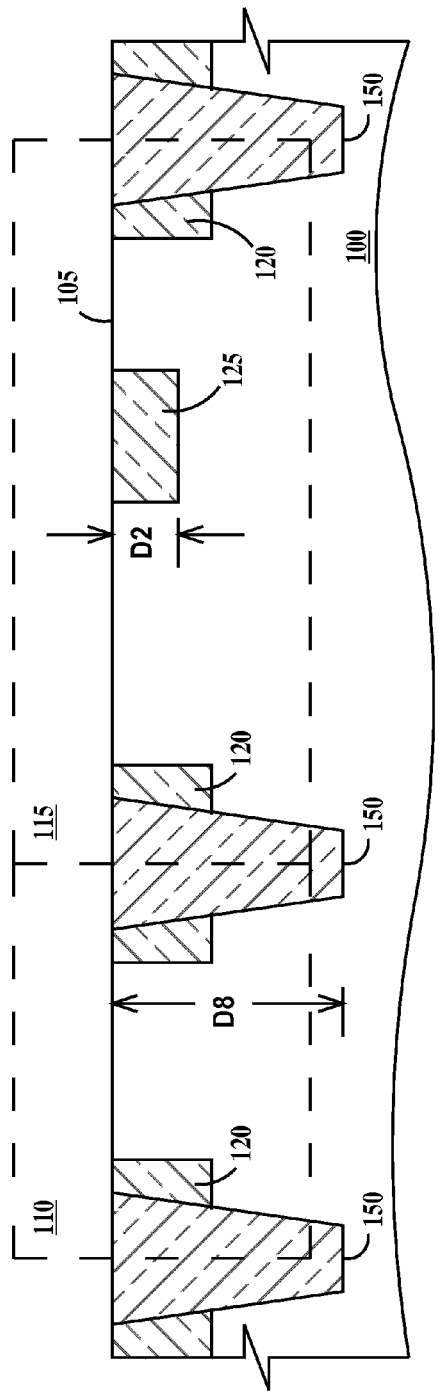
FIG. 3A is a cross-section illustrating a third inter-device isolation scheme with the first intra-device isolation scheme according to embodiments of the present invention.

FIG. 3A is a cross-section illustrating a third inter-device isolation scheme with the first intra-device isolation scheme according to embodiments of the present invention. FIG. 3A is similar to FIG. 1A, except a trench isolation (TI) 150 is formed through STI 120. In one example TI 150 comprises TEOS oxide or HDP oxide. In one example, TI 150 is formed by etching a trench through STI 120 into substrate 100, filling the trench with dielectric and then performing a CMP process. TI 150 extends a perpendicular distance D8 from top surface 105 of substrate 100 into the substrate. D8 is greater than D2.

Figure 3B:
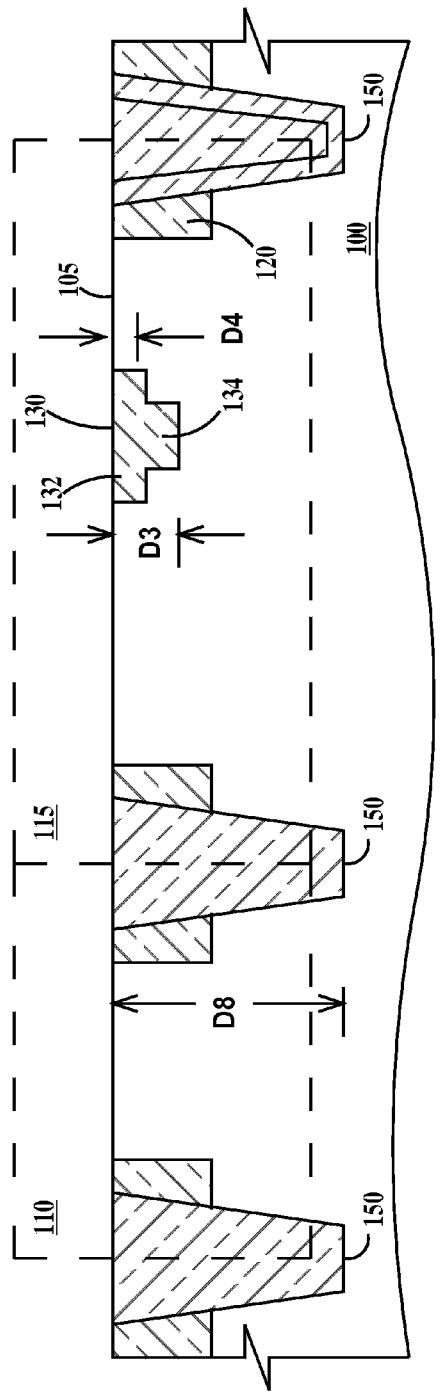
FIG. 3B is a cross-section illustrating the third inter-device isolation scheme with the second intra-device isolation scheme according to embodiments of the present invention.

FIG. 3B is a cross-section illustrating the third inter-device isolation scheme with the second intra-device isolation scheme according to embodiments of the present invention. FIG. 3B is similar to FIG. 1B, except TI 150 is formed through STI 120. TI 150 extends a perpendicular distance D8 from top surface 105 of substrate 100 into the substrate. D8 is greater than D3.

FIG. 3C is a cross-section illustrating the third inter-device isolation scheme with the third intra-device isolation scheme according to embodiments of the present invention. FIG. 3C is similar to FIG. 1C, except TI 150 is formed through STI 120. TI 150 extends a perpendicular distance D8 from top surface 105 of substrate 100 into the substrate. D8 is greater than D5.

FIG. 3D is a cross-section illustrating the third inter-device isolation scheme with the fourth intra-device isolation scheme according to embodiments of the present invention. FIG. 3D is similar to FIG. 1D, except TI 150 is formed through STI 120. TI 150 extends a perpendicular distance D8 from top surface 105 of substrate 100 into the substrate. D8 is greater than D6.

Figure 4A:
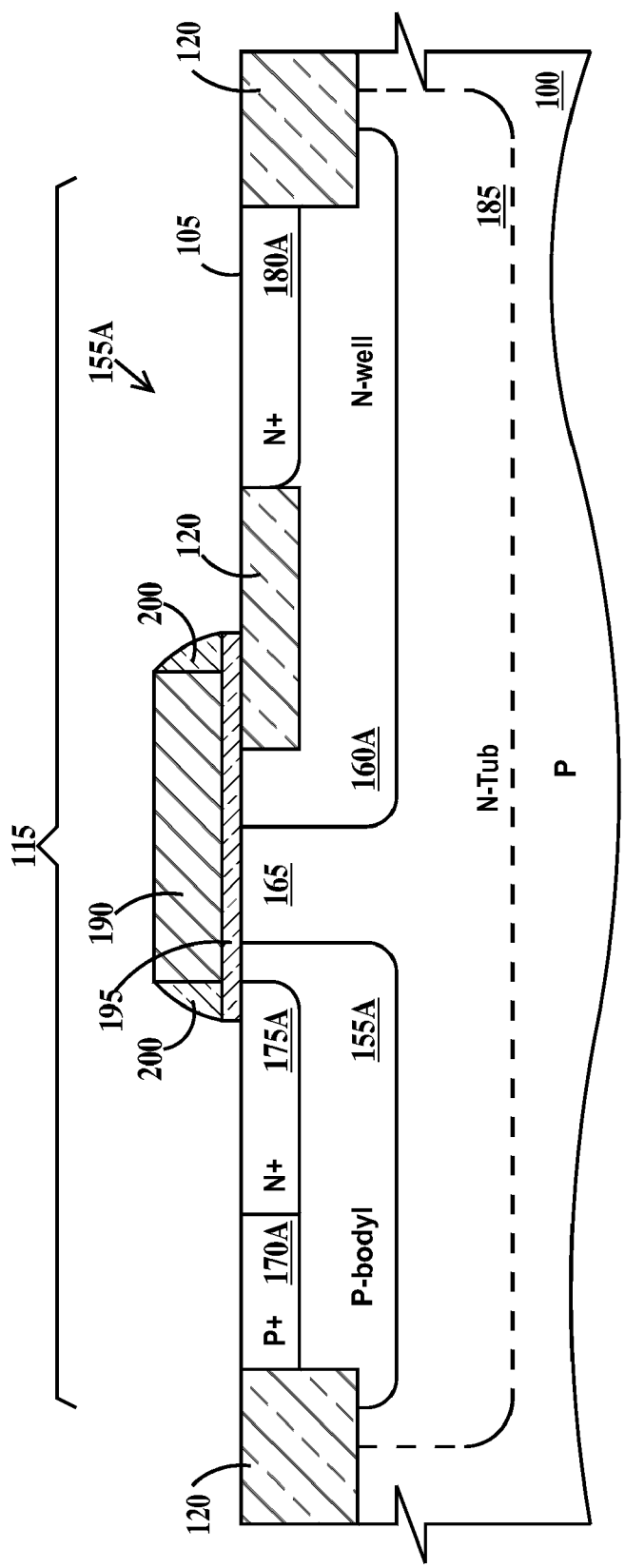
FIG. 4A is a cross-section of an exemplary first high power device that may be integrated with conventional devices according to embodiments of the present invention.
Figure 4B:
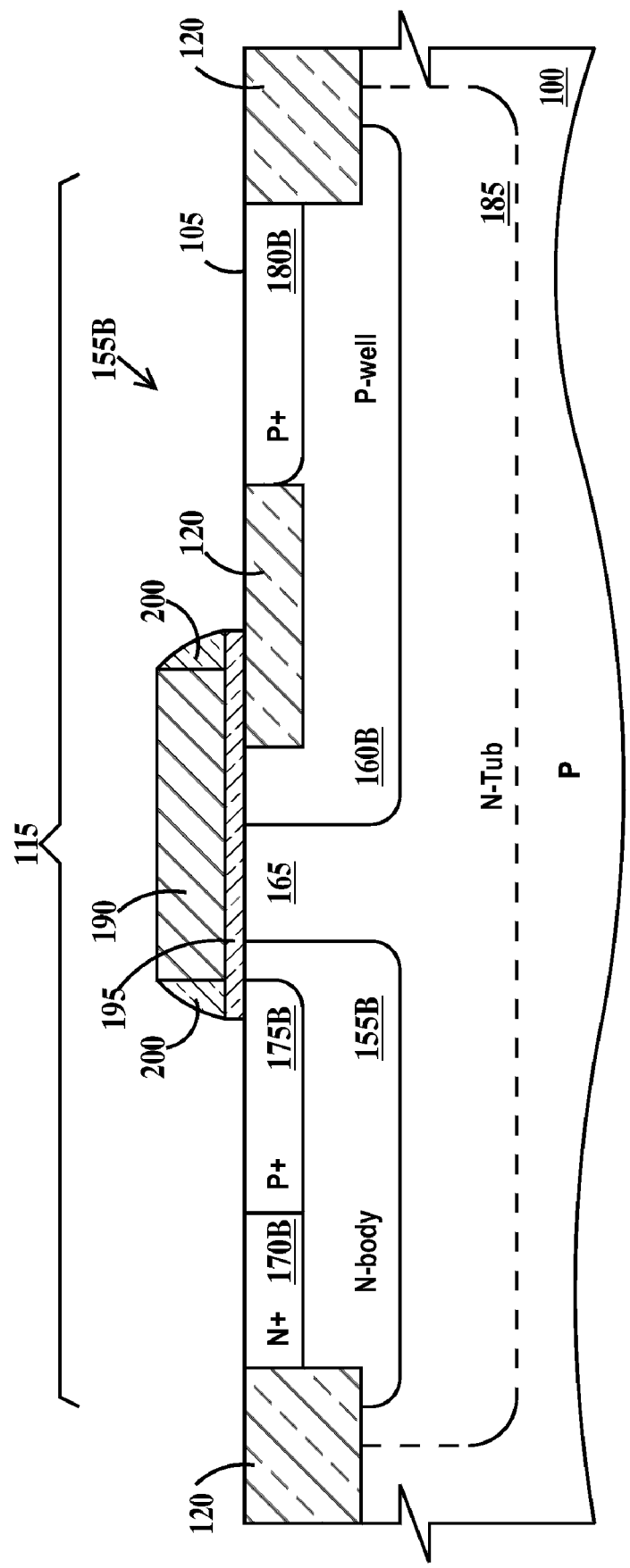
FIG. 4B is a cross-section of an exemplary second high power device that may be integrated with conventional devices according to embodiments of the present invention.
Figure 5:
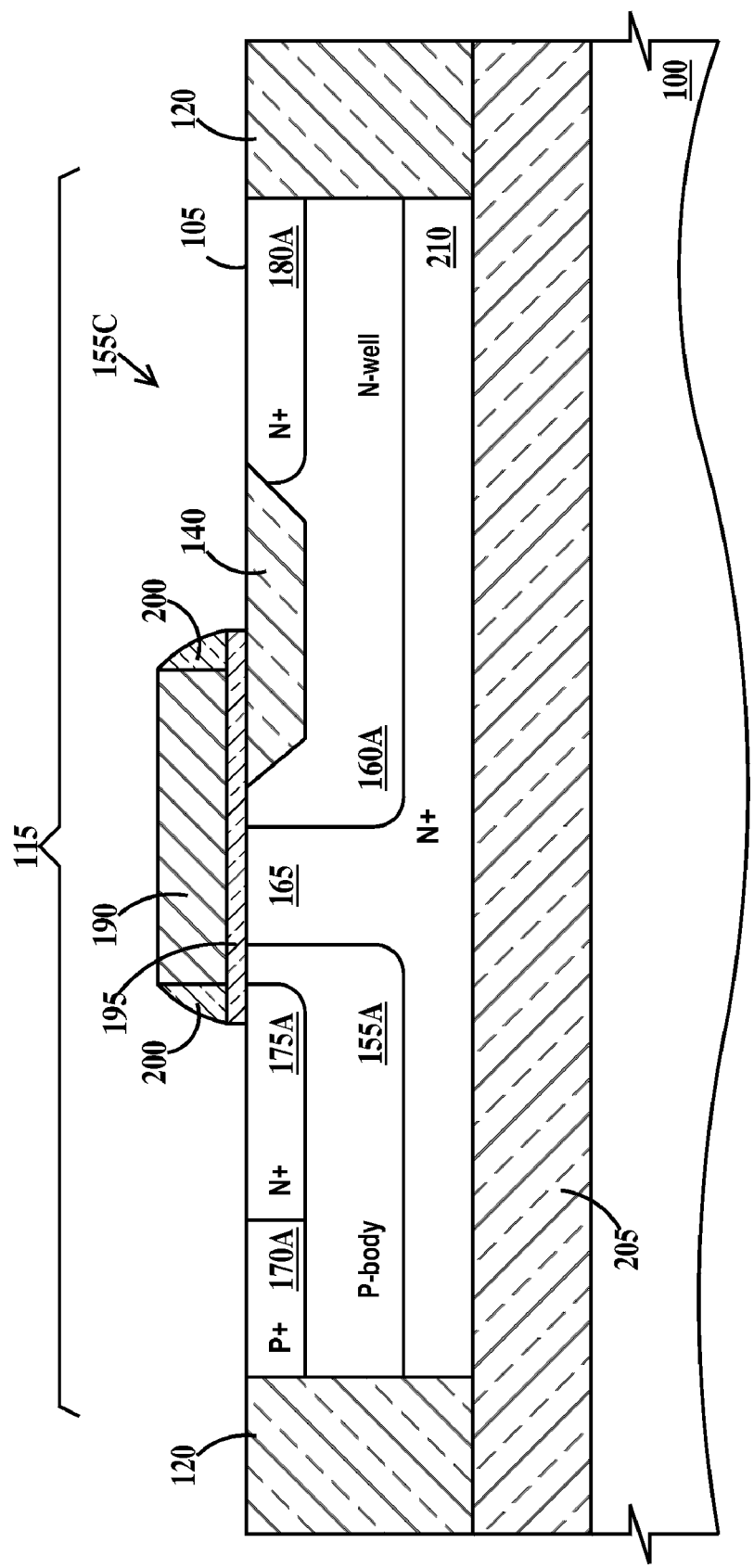
FIG. 5 is a cross-section illustrating application of the present invention to a silicon-on-insulator substrate.

FIGS. 4A, 4B and 5 illustrate types of devices that may be fabricated in second region 115. While illustrated using the isolation structure illustrated in FIG. 1A, it should be understood that the isolation structures illustrated in FIGS. 1B, 1C, 1D, 2A, 2B, 2C, 2D, 3A, 3B, 3C and 3D may be substituted.

FIG. 4A is a cross-section of an exemplary first high power device that may be integrated with conventional devices according to embodiments of the present invention. In FIG. 4A, a laterally double N-diffused MOS (NDMOS) device 155A which is a type of LDMOS device includes a P-body 155A and a N-well 160A are formed on either side of a channel region 165. Formed in P-body 155A is a P type body contact 170 and an abutting N-type source. Formed in N-well 160A is an N-type drain 180A. P-body 155A, N-well 160A and channel region 165 are formed in an n-type doped N-tub 185 when substrate 100 is P-type. An electrically conductive gate 190 is formed over and electrically isolated from top surface 105 of substrate 100 by a gate dielectric 195. Dielectric spacers 200 are formed on either sidewall of gate 190. P-body 155A extends under gate 190. Source 175A is separated from channel region 165 by P-body 155A. N-well 160A and VSTI 120 both extend under gate 190 with N-well 160A separating VSTI 120 from channel region 165. NDMOS device 155A is electrically isolated by surrounding STI 120. Body contact 170A, P-body 155A, drain 180A and N-well 160A all abut STI 120.

In a reduced surface variant of NDMOS device 155A, N-tub 185 is eliminated, the width of a now p-type channel region is reduced so P-body 155A and N-well 160A are brought much closer to each other and N-well 160A abuts but does not extend under drain 180A. In a reduced surface NDMOS (Resurf NDMOS) the N-well is called a drift region.

FIG. 4B is a cross-section of an exemplary second high power device that may be integrated with conventional devices according to embodiments of the present invention. In FIG. 4B, a laterally double P-diffused MOS (PDMOS) device 155B is similar to NDMOS device 155A of FIG. 4A except, an N-body 155B replaces P-body 155A, a P-well 160B replaces N-well 160A, an N-type body contact 170B replaces P-type body contact 170A, P-type source 175B replaces N-type source 175A and a P-type drain 180B replaces B-type drain 180A.

In a reduced surface variant of PDMOS device 155B, N-tub 185 is eliminated, the width of a now p-type channel region is reduced so N-body 155B and P-well 160B are brought much closer to each other and P-well abuts but does not extend under drain 180B. In a reduced surface PDMOS (Resurf PDMOS) the P-well is called a drift region.

FIG. 5 is a cross-section illustrating application of the present invention to a silicon-on-insulator substrate. In FIG. 5, a PDMOS device 155C is similar to NDMOS device 155A of FIG. 4A except, substrate 100 includes a buried oxide layer (BOX) 205 and NDMOS device 155C is formed in a single-crystal silicon layer 210 formed on top BOX 205. STI 120 abut BOX 205. Substrate 100 is accordingly a silicon-on-insulator (SOI) substrate. A variant of transistor 255 includes a subcollector under collector 260.

Figure 6:
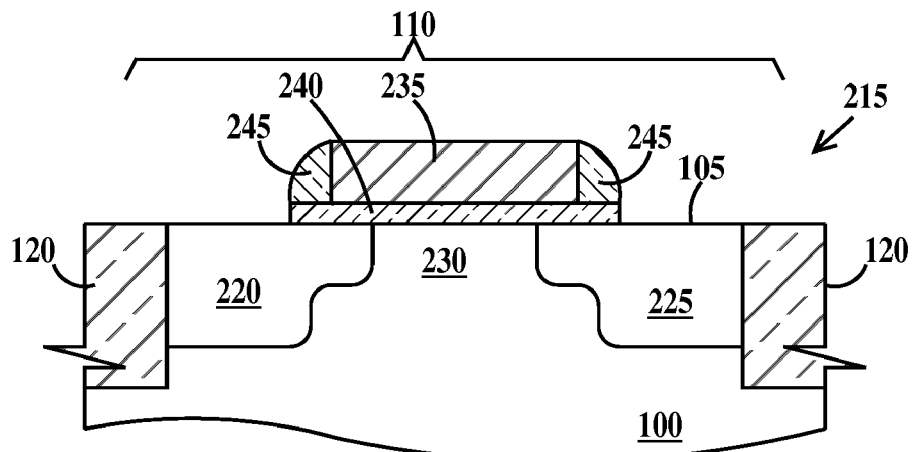
FIG. 6 is a cross-section of an exemplary first conventional power device that may be integrated with the high power devices according to embodiments of the present invention.
Figure 7:
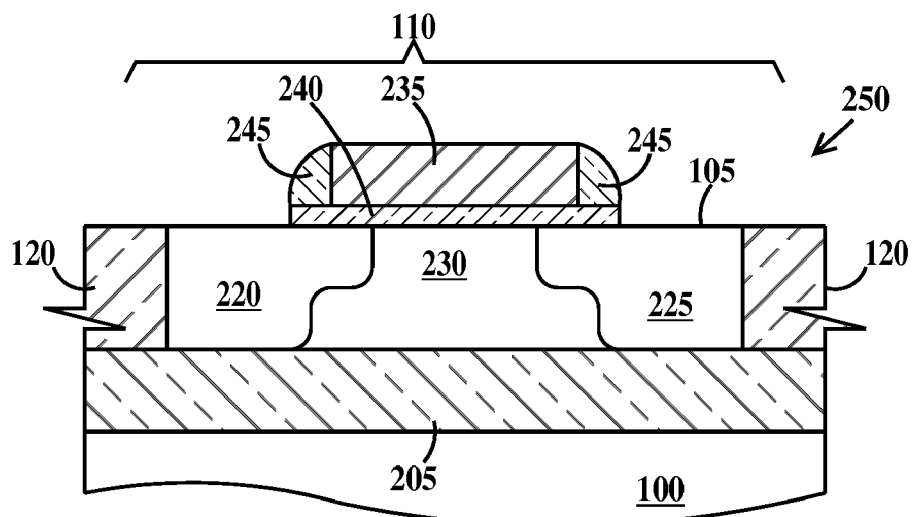
FIG. 7 is a cross-section of an exemplary second conventional power device that may be integrated with the high power devices according to embodiments of the present invention.
Figure 8:
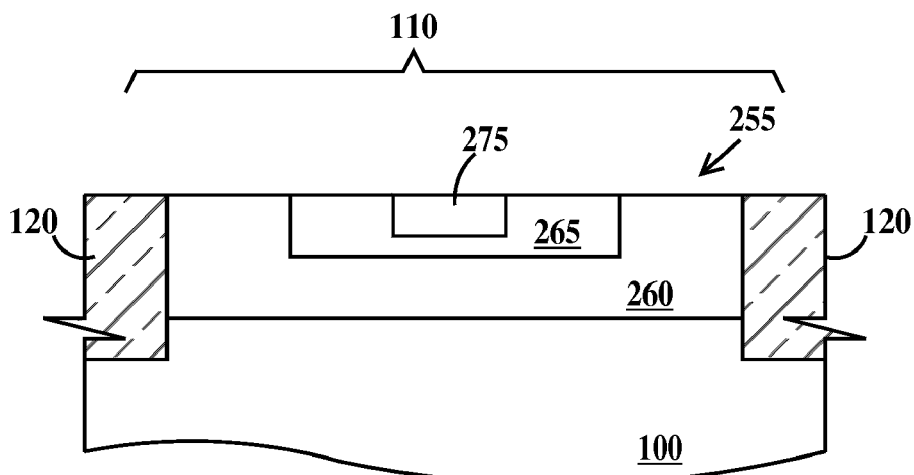
FIG. 8 is a cross-section of an exemplary third conventional power device that may be integrated with the high power devices according to embodiments of the present invention.

FIGS. 6, 7 and 8 illustrate types of devices that may be fabricated in first region 110. While illustrated using the isolation structure illustrated in FIG. 1A, it should be understood that the isolation structures illustrated in FIGS. 1B, 1C, 1D, 2A, 2B, 2C, 2D, 3A, 3B, 3C and 3D may be substituted.

FIG. 6 is a cross-section of an exemplary first conventional power device that may be integrated with the high power devices according to embodiments of the present invention. In FIG. 6, a field effect transistor (FET) 215 includes a source 220, and a drain 225 separated by a channel region 230, all formed in substrate 100. An electrically conductive gate 235 is formed over and electrically isolated from top surface 105 of substrate 100 by a gate dielectric 240. Dielectric spacers 245 are formed on either sidewall of gate 240. Both source 220 and drain 225 extends under gate 245. Both source 220 and drain 225 abut STI 120. When source 220 and drain 225 are doped n-type and channel region 230 is doped p-type, FET 215 is a N-channel FET (NFET). When source 220 and drain 225 are doped p-type and channel region 230 is doped n-type, FET 215 is a PN-channel FET (PFET).

FIG. 7 is a cross-section of an exemplary second conventional power device that may be integrated with the high power devices according to embodiments of the present invention. In FIG. 7, a FET 250 is similar to FET 215 of FIG. 6 except substrate 100 is an SOI substrate and includes a BOX layer 205. STI 120 abut BOX 205. Since source 220 and drain 225 abut BOX 205, FET 250 is a fully depleted FET. In a variant, source 220 and drain 225 do not abut BOX 205.

FIG. 8 is a cross-section of an exemplary third conventional power device that may be integrated with the high power devices according to embodiments of the present invention. In FIG. 8, a bipolar transistor 255 includes a collector 260, a base 265 formed in the collector and an emitter 275 formed in the base. Collector 260 abuts STI 120. And optional sub-collector 270 is formed under collector 260.

Another type of bipolar transistor that may be formed in first region 110 is called a heterojunction bipolar transistor (HBT). HBTs utilize different semiconductors for the elements of the transistor. Usually the emitter is composed of a larger bandgap material than the base. This helps reduce minority carrier injection from the base when the emitter-base junction is under forward bias and increases emitter injection efficiency. The improved injection of carriers into the base allows the base to have a higher doping level, resulting in lower resistance to access the base electrode. A commonly used HBT is silicon-germanium (SiGe) with the SiGe used in the base.

It should be clear that conventional devices such a MOSFETs and bipolar transistors utilize one of STI, STI/DTI, or STI/TI only the LDMOS devices utilize one of STI, STI/DTI, or STI/TI in combination with VSTI, DDSTI or LOCOS.

Finally, it should be appreciated that any one or more of the devices illustrated in FIGS. 4A, 4B, and 5 may be used with any one or more of the devices illustrated in FIGS. 6, 7 and 8 with any of the isolation schemes illustrated in FIGS. 1A, 1B, 1C, 1D, 2A, 2B, 2C, 2D, 3A, 3B, 3C and 3D. Thus, the present invention overcomes the deficiencies and limitations described supra by the use of different depths of isolation for inter and intra device isolation.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of fabricating an electronic device, comprising:
   forming a dielectric isolation in a semiconductor substrate, said dielectric isolation extending in a direction perpendicular to a top surface of said substrate into said substrate a first distance, said dielectric isolation surrounding a first region and a second region of said substrate, a top surface of said dielectric isolation coplanar with said top surface of said substrate;
   forming a dielectric region in said second region of said substrate; said dielectric region extending in said perpendicular direction into said substrate a second distance, said first distance greater than said second distance;
   forming a field effect transistor in said first region a source and a drain of said field effect transistor each abutting said dielectric isolation in said first region; and
   forming a lateral double diffused metal-oxide-silicon (LDMOS) device in said second region, a body and a well of said LDMOS device each abutting said dielectric isolation in said second region, wherein said dielectric region is in said well.

2. The method of claim 1, wherein forming said dielectric isolation includes:
   forming a trench in said substrate in said perpendicular direction;
   depositing a dielectric material onto said top surface of said substrate, said dielectric material filling said trench; and
   performing a chemical-mechanical polish to coplanarize said top surface of said dielectric isolation and said top surface of said substrate.

3. The method of claim 2, wherein forming said dielectric isolation further includes:
   forming an additional trench extending completely through dielectric isolation in said perpendicular direction and into said substrate under said dielectric isolation;
   depositing an additional dielectric material onto side surfaces of said dielectric isolation, side surfaces of said substrate, a bottom surface of substrate exposed in said additional trench and said top surface of said substrate, said additional dielectric material filling said additional trench; and
   performing an additional chemical-mechanical polish to coplanarize said top surface of said dielectric isolation and said top surface of said substrate.

4. The method of claim 2, wherein forming said dielectric isolation further includes:
   forming an additional trench extending completely through dielectric isolation in said perpendicular direction and into said substrate under said dielectric isolation;
   forming a dielectric layer on side surfaces of said dielectric isolation and side surfaces and a bottom surface of substrate exposed in said additional trench;
   depositing polysilicon onto said top surface of said substrate and said exposed surfaces of said dielectric layer, said polysilicon filling remaining space in said trench; and
   performing an additional chemical-mechanical polish to coplanarize said top surface of said dielectric isolation and said top surface of said substrate.

5. The method of claim 2, wherein forming said dielectric region in said second region of said substrate includes:
   forming a first trench in said substrate in said perpendicular direction;
   forming a second trench in said perpendicular direction within said first trench, said second trench extending further into said substrate from said top surface of said substrate than said first trench;
   depositing a dielectric material onto said top surface of said substrate, said dielectric material filling said first and second trenches; and
   performing a chemical-mechanical polish to coplanarize said top surface of said dielectric isolation and said top surface of said substrate.

6. The method of claim 1, wherein forming said dielectric region in said second region of said substrate includes:
   forming a trench in said substrate in said perpendicular direction;
   depositing a dielectric material onto said top surface of said substrate, said dielectric material filling said trench; and
   performing a chemical-mechanical polish to coplanarize said top surface of said dielectric isolation and said top surface of said substrate.

7. The method of claim 1, wherein a top surface of said dielectric region is coplanar with said top surface of said substrate.

8. The method of claim 1, wherein forming said dielectric region in said second region of said substrate includes:
   locally oxidizing said substrate to form a oxidized region, a top surface of said oxidized region extending above said top surface of said substrate;
   performing a chemical-mechanical polish to coplanarize a new top surface of said oxidized region and said top surface of said substrate.

9. The method of claim 1, wherein said LDMOS device includes a source formed in said body and a drain formed in said well and said dielectric region extends from said drain to under a gate of said LDMOS device.

10. The method of claim 9, wherein said body and said well extend under said gate and are separated by a channel region under said gate, said well between and abutting said dielectric region and said channel region, said body between and abutting said source and said channel region, and said drain between and abutting said dielectric isolation and said dielectric region.

11. The method of claim 1, wherein forming said dielectric isolation in said first region of said substrate and forming said dielectric region in said second region of said substrate includes:
   forming a first trench in said substrate in said first region in said perpendicular direction;
   forming a second trench in second region in said perpendicular direction;
   depositing a dielectric material onto said top surface of said substrate, said dielectric material filling said first and second trenches; and
   performing a chemical-mechanical polish to coplanarize said top surface of said dielectric isolation, said dielectric region and said top surface of said substrate.

12. The method of claim 1, wherein forming said dielectric isolation in said first region of said substrate and forming said dielectric region in said second region of said substrate includes:
   forming a first trench in said substrate in said first region in said perpendicular direction;
   forming a second trench in second region in said perpendicular direction;
   forming a third trench in a bottom of said second trench;
   depositing a dielectric material onto said top surface of said substrate, said dielectric material filling said first, second and third trenches; and
   performing a chemical-mechanical polish to coplanarize said top surface of said dielectric isolation, said dielectric region and said top surface of said substrate.

13. The method of claim 1, wherein said substrate includes buried oxide layer separated from said top surface of said substrate by a silicon layer, a top surface of said silicon layer being said top surface of said substrate and wherein said trench isolation abuts said buried oxide layer.

14. The method of claim 1, wherein a value of said first distance is selected to optimize inter-device leakage of said field effect transistor and a value of said second distance is chosen to optimize a speed of said LDMOS device.

15. The method of claim 1, wherein said dielectric isolation comprises a first dielectric filled trench and said dielectric region comprises a second dielectric filled trench.

16. The method of claim 1, wherein said dielectric isolation comprises a first dielectric filled trench and said dielectric region comprise a second dielectric filled trench, said second trench comprising a upper region having a first width and a bottom region having a second width, said first width greater than said second width.

17. The method of claim 1, wherein said dielectric isolation comprises a first dielectric filled trench and said dielectric region comprises a locally oxidized region.

18. The method of claim 1, wherein said dielectric isolation comprises a first dielectric filled trench and a polysilicon filled trench extending through said first dielectric filled trench and said dielectric region comprise a second dielectric filled trench.

19. The method of claim 1, wherein said dielectric isolation comprises a first dielectric filled trench and a polysilicon filled trench extending through said first dielectric filled trench and said dielectric region comprise a locally oxidized region.

20. The method of claim 1, wherein said dielectric isolation comprises a first dielectric filled trench and second dielectric filled trench extending through said first dielectric filled trench into said substrate and said dielectric region comprise a third dielectric filled trench.

\* \* \* \* \*